US007107565B1

(12) United States Patent
Lindholm et al.

(10) Patent No.: US 7,107,565 B1
(45) Date of Patent: Sep. 12, 2006

(54) PLD DEVICE REPRESENTATION WITH FACTORED REPEATABLE TILES

(75) Inventors: Jeffrey V. Lindholm, Longmont, CO (US); Keith R. Bean, Johnstown, CO (US)

(73) Assignee: Xilinx, Inc., San Jose, CA (US)

( * ) Notice: Subject to any disclaimer, the term of this patent is extended or adjusted under 35 U.S.C. 154(b) by 389 days.

(21) Appl. No.: 10/627,510

(22) Filed: Jul. 25, 2003

(51) Int. Cl.
*G06F 17/50* (2006.01)
(52) U.S. Cl. .................................................. 716/16
(58) Field of Classification Search ............ 716/16–17; 326/38, 41
See application file for complete search history.

(56) References Cited

U.S. PATENT DOCUMENTS

| 5,682,107 | A | 10/1997 | Tavana et al. | |
| 6,396,303 | B1 | 5/2002 | Young | |
| 2004/0010767 | A1* | 1/2004 | Agrawal et al. | ............ 716/16 |

OTHER PUBLICATIONS

Xilinx, Inc.; "Virtex-II Pro Platform FPGA Handbook", published Oct. 14, 2002; available from Xilinx, Inc., 2100 Logic Drive, San Jose, California 95124; pp. 19-71.

* cited by examiner

*Primary Examiner*—Paul Dinh
(74) *Attorney, Agent, or Firm*—Lois D. Cartier; Leroy D. Mannu

(57) ABSTRACT

Structures and methods of representing programmable PLD hardware tiles including common routing resources common to all of the hardware tiles and unique logic resources unique to each hardware tile. A software representation of the programmable hardware tiles includes a common software tile including a description of the common routing resources, and, for each hardware tile, a unique software tile including a description of the unique logic resources included in the hardware tile. The common software tile has first terminals for coupling an instance of the common software tile to other instances of the common software tile, and also has second terminals. The unique software tile includes terminals for coupling the unique software tile to the second terminals of an instance of the common software tile. The software representation can also include a PLD device model that utilizes a uniform numbering scheme based on numbered instances of the common software tile.

18 Claims, 6 Drawing Sheets

PLD DEVICE REPRESENTATION WITH FACTORED REPEATABLE TILES

FIELD OF THE INVENTION

The invention relates to Programmable Logic Devices (PLDs). More particularly, the invention relates to PLD device representations in which common routing portions of the various hardware tiles are factored out into a separate software tile common to all hardware tiles within at least a portion of the PLD.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional logic blocks with special purposes (e.g., DLLS, RAM, processors, and so forth).

An FPGA is typically implemented as an array of "hardware tiles", with each hardware tile including one logic block (e.g., a CLB, a RAM block, or an IOB) plus the associated routing. Thus, each hardware tile includes both programmable logic and a portion of the programmable interconnect structure. Interconnect lines included in each hardware tile typically connect to interconnect lines in adjacent hardware tiles by abutment. Interconnections among the interconnect lines, and between the interconnect lines and the logic blocks, are made using programmable structures known as "switch matrices". Switch matrices provide interconnections between physical elements by activating "programmable interconnect points", or PIPS. Hardware tiles, switch matrices, and PIPs are well known in the arts of FPGA design and software representation.

The hardware tiles are typically programmed by loading a stream of configuration data ("bitstream") into internal configuration memory cells that define how the logic blocks and interconnect structure are configured. The configuration data can be read from memory (e.g., an external PROM) or written into the FPGA by an external device. The collective states of the individual memory cells then determine the function of the FPGA.

As previously described, advanced FPGAs can include logic blocks other than the typical CLBs and IOBs. For example, the Xilinx Virtex-II Pro™ FPGA includes blocks of Random Access Memory (RAM), blocks implementing multiplier functions, and embedded processor blocks. (The Xilinx Virtex-II Pro FPGA is described in detail in pages 19–71 of the "Virtex-II Pro Platform FPGA Handbook", published Oct. 14, 2002 and available from Xilinx, Inc., 2100 Logic Drive, San Jose, Calif. 95124, which pages are incorporated herein by reference.)

Configuration bitstreams are typically generated using "place-and-route" software. Place-and-route software accepts a user circuit description (e.g., in netlist form), partitions the user circuit into units that fit within the available logic blocks (partitioning), maps the units to the available logic blocks (mapping), assigns positions to mapped logic blocks within the hardware tile array (placement), and determines acceptable routes for signals interconnecting the placed blocks (routing). A bitstream is then generated that represents the placed and routed design, such that loading the bitstream into the device implements the user design in the device.

To adequately perform the partitioning, mapping, placement, and routing functions, the FPGA implementation software must have access to an accurate representation of each of the configurable resources available in the FPGA. Traditionally, this information is stored in a variety of "software tiles", one software tile being provided for each different hardware tile available on the FPGA. For example, separate software tiles are supplied for each of the CLB tiles, IOB tiles, RAM tiles, multiplier tiles, and processor tiles in the Xilinx Virtex-II Pro FPGA. There can also be multiple software tiles for a single type of logic block, with each software tile representing a different hardware tile. For example, one software tile can represent a CLB tile encapsulated by other CLB tiles, while another software tile represents a CLB on the outer edge of an array of CLBS.

FPGAs have been increasing in size and complexity with each product generation. Some currently available FPGAs require bitstreams including several million configuration bits. Clearly, both to reduce data storage needs and to simplify the place-and-route software, it is desirable to simplify as much as possible the software tiles used to represent the various hardware tiles. One known method of simplifying the software tiles is to create separate representations for certain basic elements that are often repeated in the various tiles, e.g., PIPs. These representations can then be referenced by more than one software tile rather than being completely respecified each time they are used. However, the correspondence between hardware tiles and software tiles is maintained by known software representations, regardless of the hierarchical nature of the software tile.

Clearly, it is desirable to further simplify PLD software representations, preferably using methods that also simplify the functionality of the PLD place-and-route software.

SUMMARY OF THE INVENTION

The invention provides structures and methods of representing programmable PLD hardware tiles that include common routing resources common to all of the hardware tiles and unique logic resources unique to each hardware tile. A software representation of the hardware tiles includes a common software tile that includes a description of the common routing resources, and, for each hardware tile, a unique software tile that includes a description of the unique logic resources included in the hardware tile. The common software tile has first terminals for coupling an instance of the common software tile to other instances of the common software tile, and also has second terminals. The unique software tile includes terminals for coupling the unique software tile to the second terminals of an instance of the common software tile.

In some embodiments, each hardware tile also includes unique routing resources unique to each hardware tile, and the unique software tile for each hardware tile includes a unique description of the unique routing resources included in the hardware tile.

In some embodiments, the software representation also includes a PLD device model representing a placement of the hardware tiles and comprising instances of the common software tile and the unique software tile. In some embodiments, the PLD device model utilizes a uniform numbering scheme based on numbered instances of the common software tile.

The invention also encompasses related methods of representing programmable PLD hardware tiles, and computer-readable storage media in which the software representations of the invention are stored.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
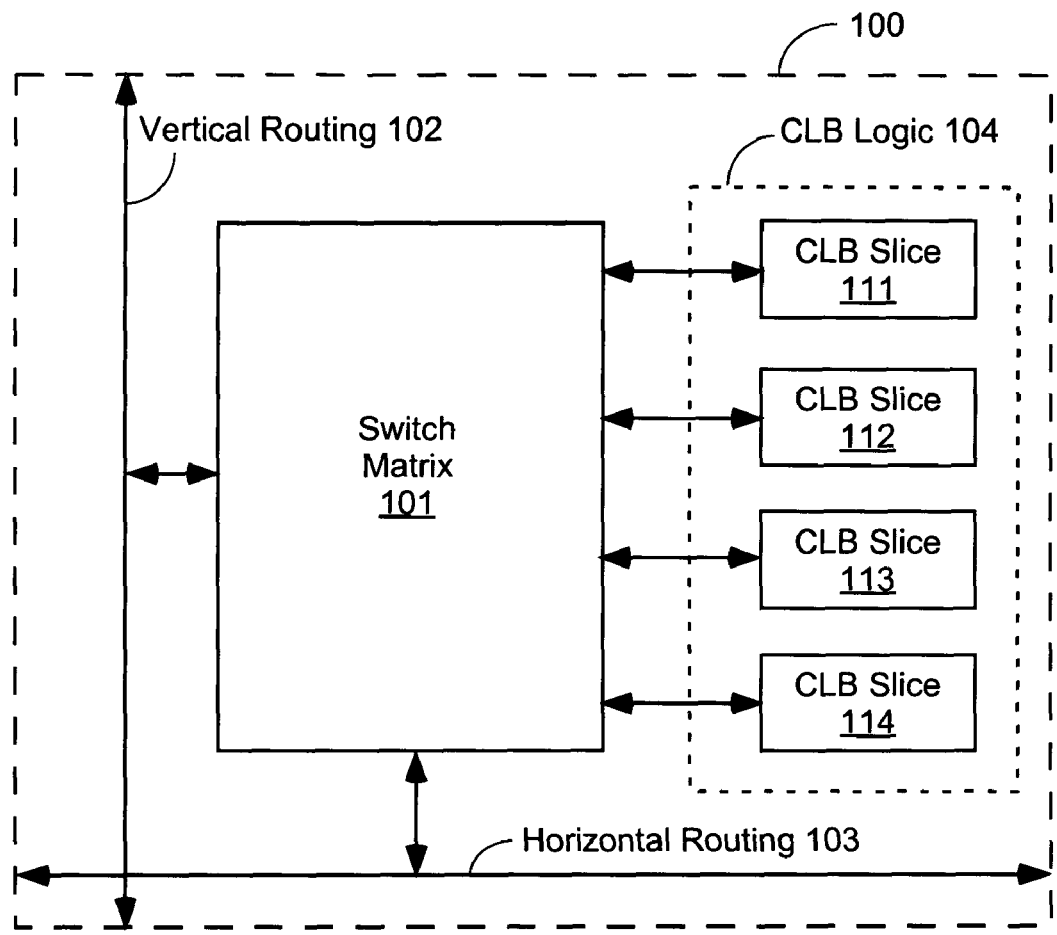
FIG. 1 illustrates a CLB hardware tile in a known PLD, and also the known corresponding software tile.

FIG. 1 illustrates a CLB tile in a known PLD, and also provides a visual representation of the corresponding software tile. Element 100 of FIG. 1 represents both a hardware tile and a corresponding software tile. The pictured tile includes four block elements: a switch matrix ("magic box") 101, a vertical routing channel 102, a horizontal routing channel 103, and a logic block 104 that includes four similar CLB slices 111–114. Switch matrix 101 provides programmable interconnections between and among vertical routing channel 102, horizontal routing channel 103, and the four CLB slices 111–114 included in logic block 104.

A software representation of the hardware tile of FIG. 1 can be as follows, for example.

Tiledef center-tile 2,2 {
Block clb c {Location +1, +0;}
Block magic-box m {Location +0, +1;}
Block vhcan v {Location +0, +0;}
Block hchan h {Location +1, +1;}
}

Each of the four blocks in the software tile is defined by a separate statement that provides a name and location for the block within the software tile. After defining the software tile, various instances of the software tile are instantiated, e.g., as follows.

Tile chip[x=1:$-1][y=1:$-1] center-tile 2*x, 2*y+1

After instantiation, the logical adjacency of the software tiles can be indicated, e.g., using a link statement. For example, the following link statement connects the north side of the horizontal channel "h" in each software tile to the "south" side of the CLB "c" in the software tile to the "north". (In the present specification, the term "north" as applied to the figures refers to the direction towards the top of the figure, "south" refers to the direction towards the bottom of the figure, and so forth.)

Link chip[x=1:$-1][y=1:$-2].h.north chip[x][y+1].c.south

The contents of the various blocks are also defined. For example, the "clb" block can define all the pins in the CLB, the interconnect lines of various types that connect to the CLB, and the PIPs from the pins to the interconnect lines and to other pins. The "magic-box" block can define all the interconnect lines and their interconnecting PIPs in the switch matrix. The horizontal and vertical channel blocks can define the various interconnect lines that make up these channels.

Various data structures can be used to define the blocks within the software tile. Block definition structures are well known in the arts of PLD device modeling and place-and-route software. Therefore, examples are not included herein.

The present invention applies a different approach to the challenge of simplifying a software tile. Instead of or in addition to applying a hierarchical approach, as in the prior art software tile described above, a hardware tile according to the present invention is factored into common and unique elements. For example, a CLB tile (FIG. 2) and a block RAM tile (FIG. 3) can each be factored into a common portion (e.g., routing) and a unique portion (e.g., the logic block). A common software tile is provided to represent the hardware elements common to the various hardware tiles. Separate software tiles are then provided for the unique hardware elements.

The invention takes advantage of the fact that it is often desirable for a PLD to use repetitive routing structures for many or all of the logic blocks within the array. The more repetitive the routing structure, the more easily the place-and-route software can route signals among the various types of logic blocks. Thus, the use of common routing structures among the various hardware tiles simplifies both the software representation of the device, and the place-and-route software needed to implement a user design in the PLD.

Figure 2:
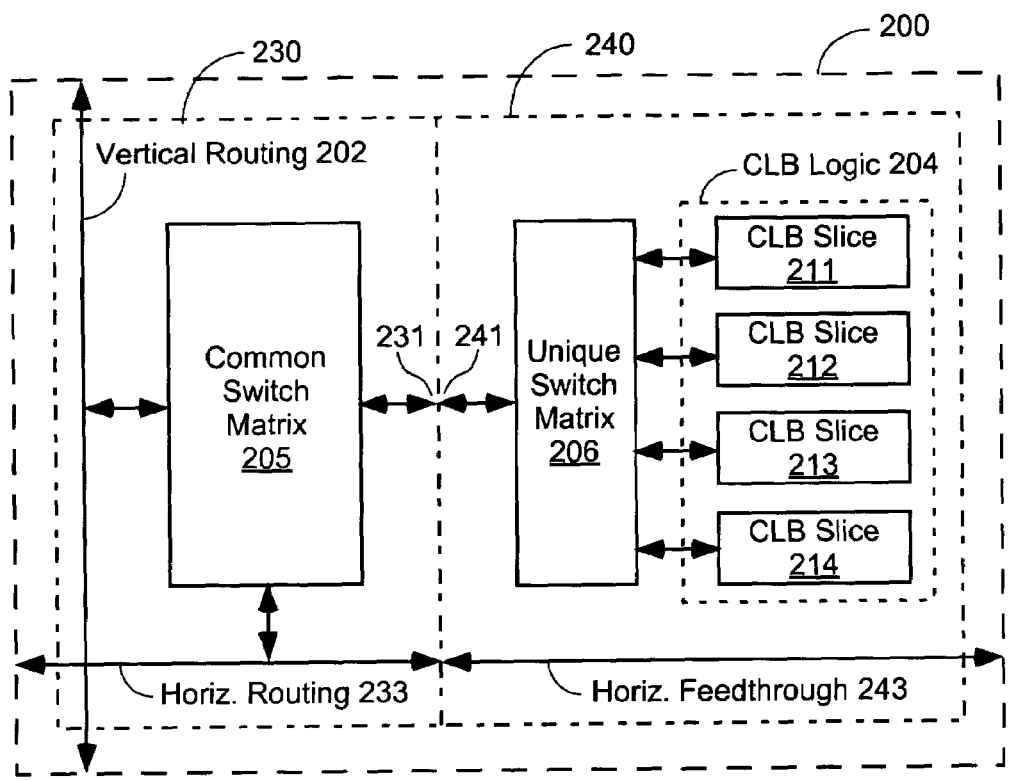
FIG. 2 illustrates a CLB hardware tile and the corresponding common and unique software tiles according to an embodiment of the present invention.

FIG. 2 illustrates a CLB tile, and also provides a visual representation of the corresponding software tiles, according to an embodiment of the present invention. The hardware tile 200 of FIG. 2 includes six block elements: a common switch matrix 205, a vertical routing channel 202, a horizontal routing channel 233, a unique switch matrix 206, a logic block 204 that includes four similar CLB slices 211–214, and a horizontal feedthrough 243. Horizontal feedthrough 243 continues horizontal routing channel 233 to the "east" edge of the hardware tile, to connect by abutment to the "west" edge of the adjacent tile. In the pictured embodiment, horizontal feedthrough 243 is not programmable, and merely provides connection by abutment to the adjacent tile.

Common switch matrix 205 provides programmable interconnections between and among vertical routing channel 202, horizontal routing channel 233, and unique switch matrix 206. Unique switch matrix 206 provides programmable interconnections between common switch matrix 205 and the four CLB slices 211–214 included in logic block 204.

Two different software tiles are used to represent hardware tile 200: common software tile 230 and unique software tile 240. Interconnections between the routing structures of adjacent hardware tiles 200 are included in common software tile 230. However, unique software tile 240 can optionally also include interconnections to other unique software tiles 240. For example, in one embodiment unique software tile 240 includes vertical interconnections such as carry chain connections and shift register connections (not shown) between the CLB slices, including between adjacent CLB slices in abutting hardware tiles to the north and south.

A software representation of common software tile 230 of FIG. 2 can be as follows, for example.

Tiledef common-tile 2,2 {
Block cmagic-box cm {Location +0, +1;}
Block vhcan v {Location +0, +0;}
Block hchan h {Location +1, +1;}
}

A software representation of unique CLB software tile 240 of FIG. 2 can be as follows, for example.

Tiledef uclb-tile 2,2 {
Block ucmagic-box um {Location +0, +0;}
Block uclb uc {Location +1, +0;}
Block feedthrough f {Location +1, +1;}
}

The above syntax is merely exemplary, and any syntax can be used. In some embodiments, the software tiles are graphically described using CAD (computer aided design) drafting tools, and the resulting syntax is a function of the CAD software employed.

As in the embodiment of FIG. 1, each of the blocks in the common and unique software tiles is defined by a separate statement that provides a name and location for the block within the software tile. After defining the software tile, various instances of the software tile are instantiated, linking is established, and the contents of the various blocks are defined, e.g., using known techniques such as those described above in connection with FIG. 1. Note that in addition to the links formed in the example of FIG. 1, common software tile 230 is also linked with unique software tile 240. For example, terminal 231 of common software tile 230 is linked with terminal 241 of unique software tile 240.

Figure 3:
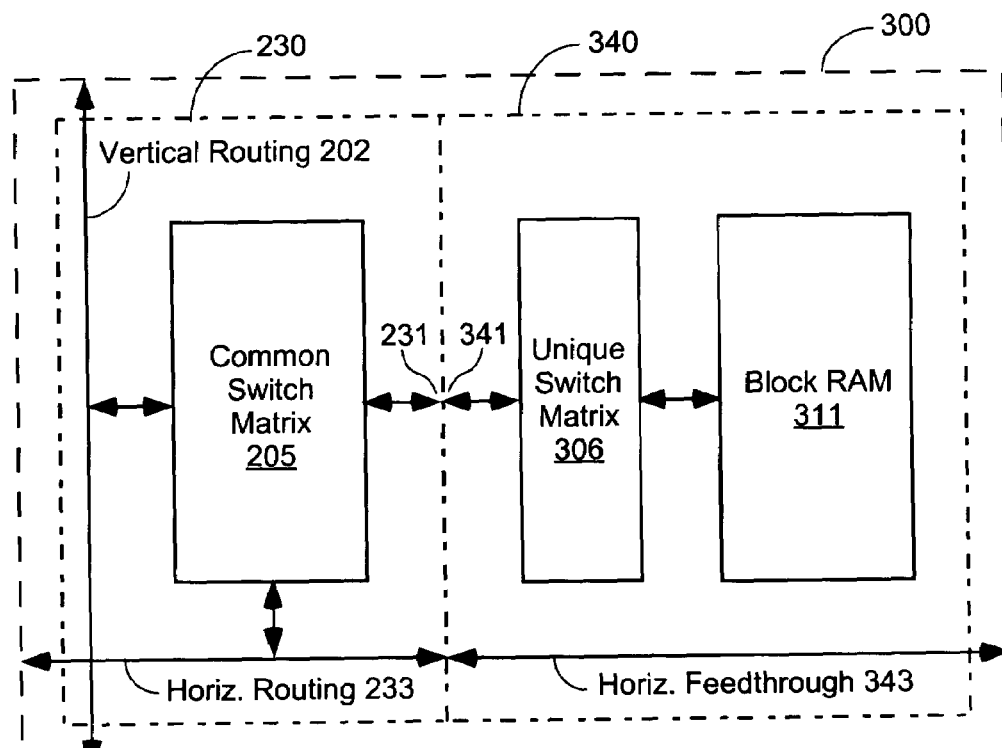
FIG. 3 illustrates a block RAM hardware tile and the corresponding common and unique software tiles according to an embodiment of the present invention.

Much of the benefit of the present invention is derived from the fact that the common software tile is used in conjunction with various software tiles representing various types of logic blocks. FIG. 3 illustrates the application of the embodiment of FIG. 2 to a block RAM hardware tile. The hardware tile 300 of FIG. 3 includes six block elements: a common switch matrix 205, a vertical routing channel 202, a horizontal routing channel 233, a unique switch matrix 306, a block RAM 311, and a horizontal feedthrough 343. Horizontal feedthrough 343 continues horizontal routing channel 233 to the "east" edge of the hardware tile, to connect by abutment to the "west" edge of the adjacent tile.

Importantly, vertical routing channel 202, horizontal routing channel 233, and common switch matrix 205 are the same in both of FIGS. 2 and 3. Thus, software tile 230 is the same in both figures, and the same software tile definition can be used in conjunction with both CLB and RAM blocks, for example.

Unique software tile 340 is of course different from unique software tile 240. Unique software tile 340 includes unique switch matrix 306, block RAM 311, and horizontal feedthrough 343. Unique switch matrix 306 provides programmable interconnections between common switch matrix 205 and block RAM 311. In the pictured embodiment, horizontal feedthrough 343 is not programmable, and merely provides connection by abutment to the adjacent tile.

A software representation of unique block RAM (BRAM) software tile 340 of FIG. 3 can be as follows, for example.

Tiledef ubram-tile 2,2 {
Block urmagic-box urm {Location +0, +0;}
Block uram ur {Location +1, +0;}
Block feedthrough f {Location +1, +1;}
}

Note that in the pictured embodiment block "feedthrough" is the same as in software tile "uclb-tile".

As in the embodiments of FIGS. 1–2, each of the blocks in the common and unique software tiles is defined by a separate statement that provides a name and location for the block within the software tile. After defining the software tile, various instances of the software tile are instantiated, linking is established, and the contents of the various blocks are defined, e.g., using known techniques such as those described above in connection with FIG. 1. Note that common software tile 230 is linked with unique software tile 340. For example, terminal 231 of common software tile 230 is linked with terminal 341 of unique software tile 340.

Figure 4:
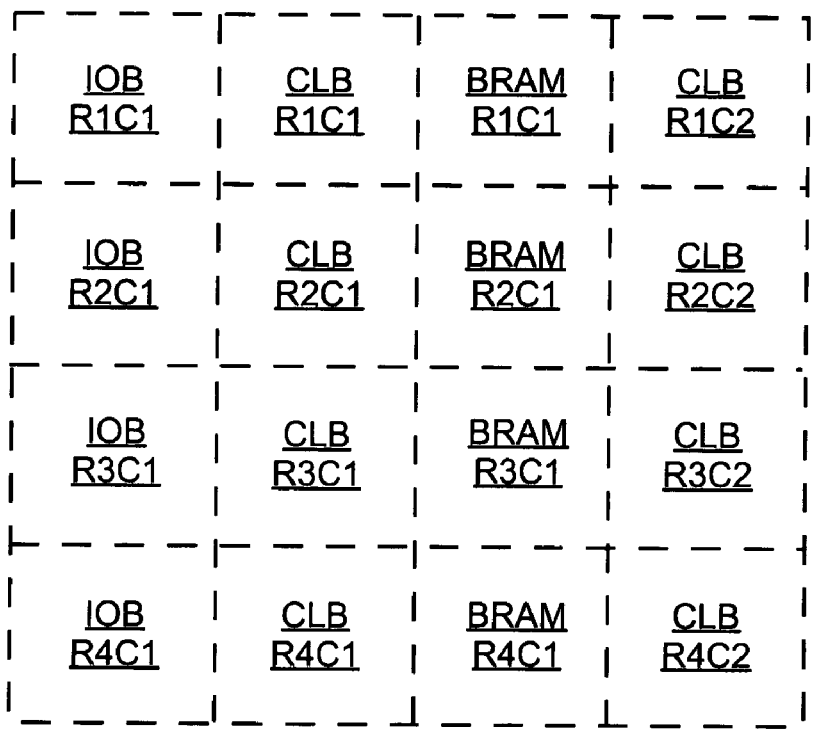
FIG. 4 illustrates a known numbering scheme typically applied to an FPGA software representation and comprising an array of mixed software tiles.

A PLD software representation includes many rows and many columns of software tiles. Clearly, a system is necessary for identifying each tile, preferably by its location in the tile array. In the prior art representation of FIG. 1, there is a one-to-one correspondence between hardware tiles and software tiles. Therefore, each software tile is typically assigned an identification based on the location of the corresponding hardware tile in the hardware array. FIG. 4 illustrates the effects of a known method of identifying software tiles in a PLD software representation based on the numerical coordinates of the corresponding hardware tiles. The method illustrated in FIG. 4 can be used, for example, with the software representation associated with FIG. 1.

According to the method illustrated in FIG. 4, the first column of each type of software tile is given a name that reflects its relative location. For example, the first column of tiles includes only IOBs. Thus, the first column of IOBs includes IOB R1C1 in the top row of tiles, IOB R2C1 in the second row of tiles, and so forth. The first column of CLBs includes CLB R1C1 in the top row of tiles, CLB R2C1 in the second row of tiles, and so forth. The first column of block RAMs (BRAMs) includes BRAM R1C1 in the top row of tiles, BRAM R2C1 in the second row of tiles, and so forth. In the rightmost illustrated column, the second column of CLBs includes CLB R1C2 in the top row of tiles, CLB R2C2 in the second row of tiles, and so forth.

Figure 5:
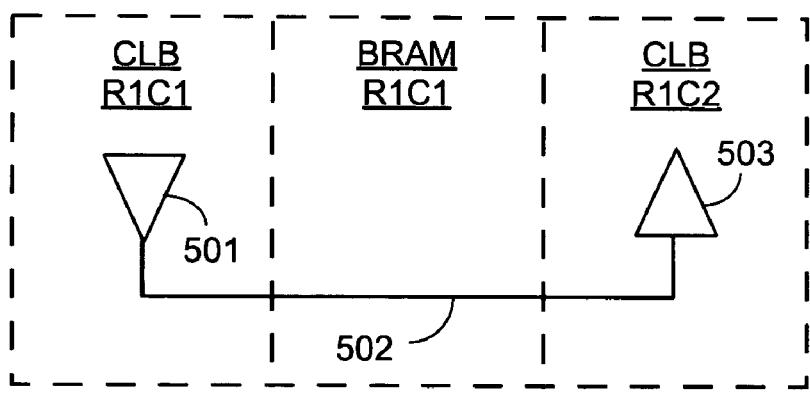
FIG. 5 illustrates a "double" interconnect connection when the numbering scheme of FIG. 4 is used.

FIG. 5 illustrates how a "double" interconnect line is implemented when the known structures and methods of FIGS. 1 and 4 are applied. A "double" interconnect line is an interconnect line that programmably interconnects two hardware tiles separated by one intervening hardware tile. In the illustrated example, the double interconnect line 502 originates at buffer 501 in tile CLB R1C1, then travels across intervening tile BRAM R1C1 to terminate at buffer 503 in tile CLB R1C2.

Figure 6:
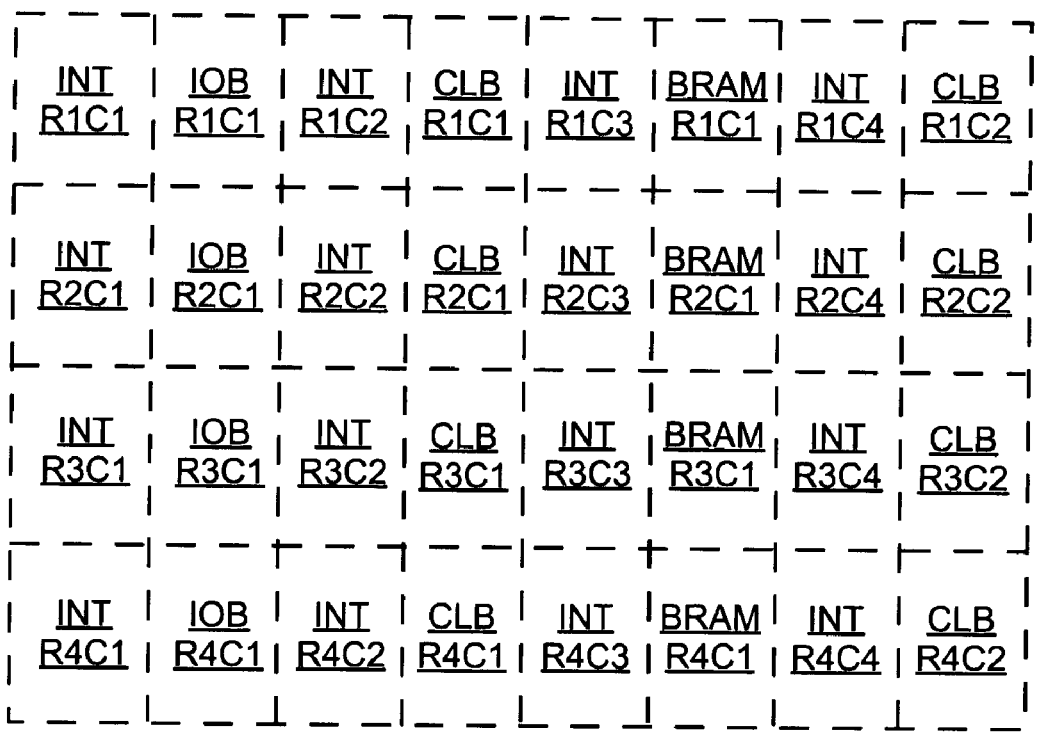
FIG. 6 illustrates a first numbering scheme that can be applied to an FPGA software representation based on numbered instances of a common software tile, according to an embodiment of the present invention.

FIG. 6 illustrates a first method of identifying software tiles in a PLD software representation based on numbered instances of the common software tile. The method illustrated in FIG. 6 can be used, for example, with the software representation associated with FIGS. 2 and 3.

According to the method illustrated in FIG. 6, the first column of each type of software tile is given a name that reflects its relative location. However, each hardware tile is now represented by two separate software tiles, a common interconnect tile (INT) and a unique tile (IOB, CLB, BRAM). Thus, compared to the representation illustrated in FIG. 4, each column of software tiles is replaced by a column of INT tiles and a column of unique tiles.

For example, the first column of tiles is a column of INT tiles. Thus, the first column of INT tiles includes INT R1C1 in the top row of tiles, INT R2C1 in the second row of tiles, and so forth. Next is a column of unique IOB tiles, which includes IOB R1C1 in the top row of tiles, IOB R2C1 in the second row of tiles, and so forth. (Note that the term "unique" as used herein means that the IOB tile is distinct from the other "unique" tiles, e.g., CLBs and BRAMs. The term is not meant to imply that the IOB tiles are unique one from another.) The column of IOBs is followed by another column of INT tiles. Because this is the second column of INT tiles, the column includes INT R1C2 in the top row of tiles, INT R2C2 in the second row of tiles, and so forth. Next is the first column of CLB tiles, which includes CLB R1C1 in the top row of tiles, CLB R2C1 in the second row of tiles, and so forth. The naming convention continues, with the common INT tiles being numerically identified separately from the associated unique tiles.

However, note that in the illustrated embodiment interconnections between hardware tiles are made by forming connections between the common software tiles (INT). Therefore, the software tiles between which the hardware-tile-to-hardware-tile connections are made are identified using a uniform coordinate scheme based on the numbered instances of the common software tiles (e.g., the INT tiles in FIGS. 6 and 7).

Figure 7:
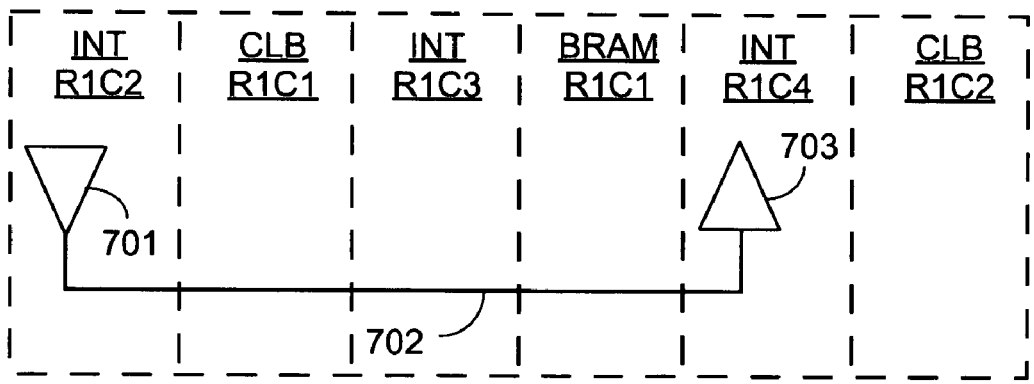
FIG. 7 illustrates a "double" interconnect connection compatible with the numbering scheme of FIG. 6.

For example, FIG. 7 illustrates how a double interconnect line is implemented when the numbering scheme of FIG. 6 is applied. In the illustrated example, double interconnect line 702 originates at buffer 701 in tile INT R1C2, and travels across unique tile CLB R1C1. (Note that software tiles INT R1C2 and CLB R1C1 together represent a single hardware tile.) Double line 702 then traverses the intervening hardware tile comprising tiles INT R1C3 and BRAM R1C1 to reach the "separated-by-one" hardware tile represented by software tiles INT R1C4 and CLB R1C2. Double line 702 then terminates at buffer 703 in software tile INT R1C4.

Figure 8:
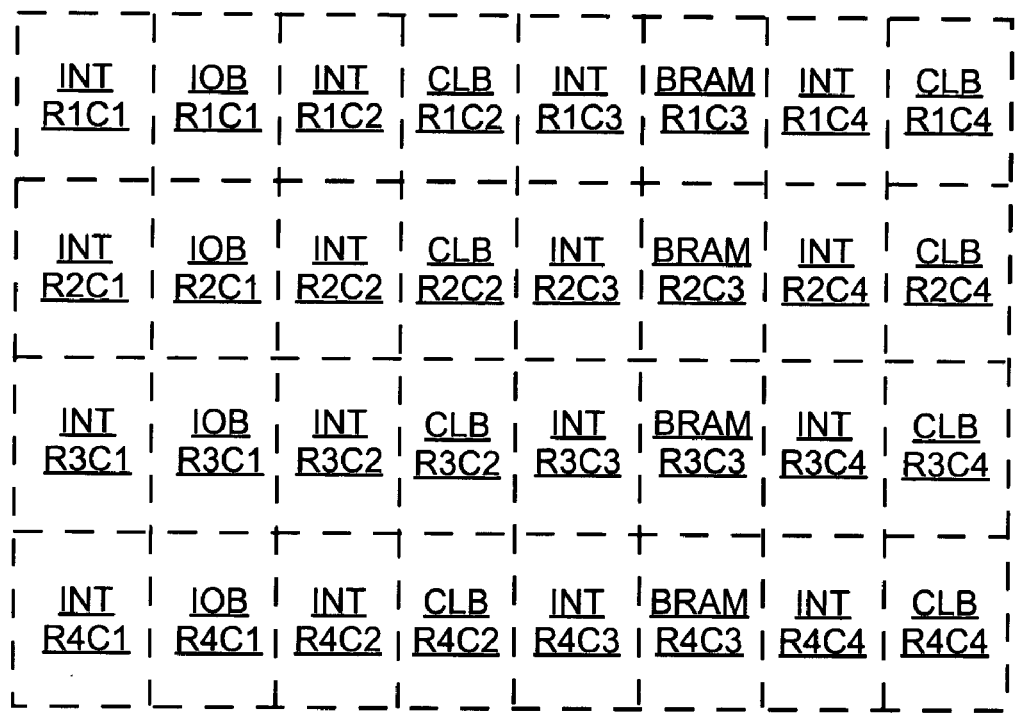
FIG. 8 illustrates a second numbering scheme that can be applied to an FPGA software representation based on numbered instances of a common software tile, according to an embodiment of the present invention.

FIG. 8 illustrates a second method of identifying software tiles in a PLD software representation based numbered instances of the common software tile. The method illustrated in FIG. 8 can be used, for example, with the software representation associated with FIGS. 2 and 3.

According to the method illustrated in FIG. 8, the first column of each type of software tile is given a name that reflects its relative location. The method of FIG. 8 is similar to that of FIG. 6. However, FIG. 8 illustrates a software representation in which the unique software tiles bear column designators based on those of the associated common software tiles. Thus, the first column of CLB tiles includes CLB R1C2 in the top row of tiles, CLB R2C2 in the second row of tiles, and so forth, because the column of CLB tiles is associated with the second column of common INT tiles.

Figure 9:
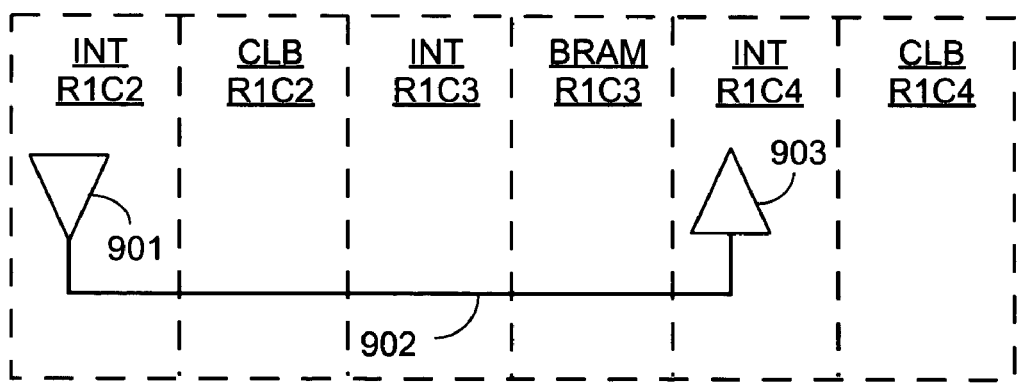
FIG. 9 illustrates a "double" interconnect connection when the numbering scheme of FIG. 8 is used.

FIG. 9 illustrates how a double interconnect line is implemented when the numbering scheme of FIG. 8 is applied. In the illustrated example, double interconnect line 902 originates at buffer 901 in tile INT R1C2, and travels across unique tile CLB R1C2. (Note that software tiles INT R1C2 and CLB R1C2 together represent a single hardware tile.) Double line 902 then traverses the intervening hardware tile comprising tiles INT R1C3 and BRAM R1C3 to reach the "separated-by-one" hardware tile represented by software tiles INT R1C4 and CLB R1C4. Double line 902 then terminates at buffer 903 in software tile INT R1C4.

Figure 10:
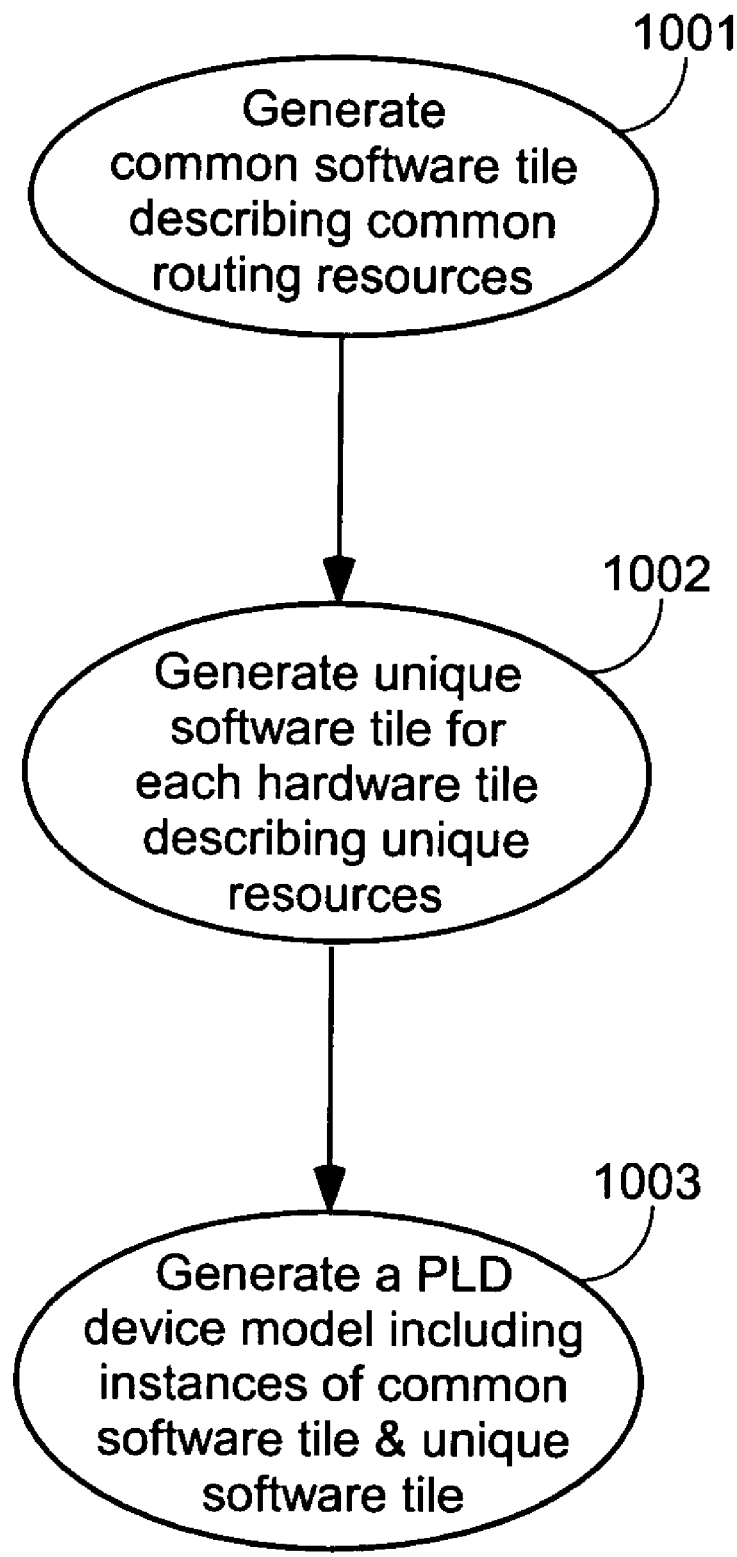
FIG. 10 illustrates the steps of a method of representing programmable hardware tiles included in a PLD, according to an embodiment of the present invention.

FIG. 10 illustrates the steps of a method of representing programmable hardware tiles included in a programmable logic device (PLD), where each hardware tile includes common routing resources common to all of the hardware tiles and unique logic resources unique to each hardware tile. In step 1001, a common software tile is generated that includes a description of the common routing resources. The common software tile has first terminals for coupling an instance of the common software tile to other instances of the common software tile, and also has second terminals.

In step 1002, a unique software tile is generated for each hardware tile that includes a description of the unique resources included in the hardware tile. In some embodiments, the unique resources include only logic resources. In other embodiments, the unique resources include both logic and routing resources. The unique software tile includes terminals for coupling the unique software tile to the second terminals of an instance of the common software tile.

In step 1003, a PLD device model is generated that represents a placement of the programmable hardware tiles in the PLD. The PLD device model includes instances of the common software tile and the unique software tile. In some embodiments, the PLD device model utilizes a uniform numbering scheme based on numbered instances of the common software tile.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. For example, the above text describes the structures and methods of the invention in the context of programmable logic devices (PLDS) such as Field Programmable Gate Arrays (FPGAs). However, the concepts of the invention can also be applied to other programmable devices, which include but are not limited to Complex Programmable Logic Devices (CPLDs), mask programmable devices such as Application Specific ICs (ASICs), fuse and anti-fuse devices, and devices in which only a portion of the logic is programmable.

Accordingly, all such modifications and additions are deemed to be within the scope of the invention, which is to be limited only by the appended claims and their equivalents.

What is claimed is:

1. A method of representing resources of a programmable logic device (PLD), the method comprising:
generating a plurality of instances of a common software tile from a first source code definition of the common software tile comprising a description of common routing resources, of first terminals for coupling an instance of the common software tile to other instances of the common software tile, and of second terminals; and
generating a plurality of instances of each of a plurality of unique software tiles from respective source code definitions of the plurality of unique software tiles, each respective source code definition comprising a description of unique logic resources and of terminals for coupling an instance of the unique software tile to the second terminals of an instance of the common software tile, wherein the first source code definition of the common software tile and the respective source code definitions of the unique software tiles are separate data structure definitions.

2. The method of claim 1, wherein:
each respective source code definition of a unique software tile further includes unique routing resources unique to the unique software tile; and
generating an instance of the unique software tile comprises generating a unique description of the unique routing resources included in the unique software tile.

3. The method of claim 1, wherein the PLD is a Field Programmable Gate Array (FPGA).

4. The method of claim 3, wherein the unique logic resources comprise at least one of the following types of logic blocks: configurable logic blocks (CLBs), Random Access Memory (RAM) blocks, multiplier blocks, and processor blocks.

5. The method of claim 4, wherein the unique logic resources comprise input/output blocks (IOBs).

6. The method of claim 1, further comprising generating a PLD device model representing a placement of the instances of the common software tile and the unique software tiles utilizing a uniform numbering scheme based on numbered instances of the common software tile.

7. The method of claim 1, wherein the plurality of instances of the common software tile and the unique software tiles comprise an entirety of the programmable hardware tiles in the PLD.

8. An article of manufacture, comprising:
a processor-readable program storage medium configured with processor-executable instructions for representing resources of a programmable logic device (PLD), by performing the steps including,
generating a plurality of instances of a common software tile from a first source code definition of the common software tile comprising a description of common routing resources, of first terminals for coupling an instance of the common software tile to other instances of the common software tile, and of second terminals; and
generating a plurality of instances of a plurality of unique software tiles from a respective source code definitions of the plurality of unique software tiles, each respective source definition comprising a description of unique logic resources, and of terminals for coupling an instance of the unique software tile to the second terminals of an instance of the common software tile, wherein the first source code definition of the common software tile and the respective source code definition of the unique software tile are separate data structure definitions.

9. The article of manufacture of claim 8, wherein:
each respective source code definition of a unique software tile further includes unique routing resources unique to the unique software tile; and
generating an instance of the unique software tile comprises generating a unique description of the unique routing resources included in the unique software tile.

10. The article of manufacture of claim 8, wherein the PLD is a Field Programmable Gate Array (FPGA).

11. The article of manufacture of claim 10, wherein the unique logic resources comprise at least one of the following types of logic blocks: configurable logic blocks (CLBs), Random Access Memory (RAM) blocks, multiplier blocks, and processor blocks.

12. The article of manufacture of claim 11, wherein the unique logic resources comprise input/output blocks (IOBs).

13. The article of manufacture of claim 8, further comprising generating a PLD device model representing a placement of the instances of the common software tile and the unique software tiles utilizing a uniform numbering scheme based on numbered instances of the common software tile.

14. The article of manufacture of claim 8, wherein the plurality of instances of the common software tile and the unique software tiles comprise an entirety of the programmable hardware tiles in the PLD.

15. A processor-based method for representing resources of a field programmable gate array (FPGA), comprising:
establishing in a computer memory, a plurality of instances of a first type tile from a source code specification of the first type tile, wherein the source code specification of the first type tile specifies a programmable switch matrix, a first set of pins for coupling to instances of the first type tile, and a second set of pins; and
establishing in a computer memory from respective source code specifications of a plurality of unique types of tiles, a respective plurality of instances for each of the plurality of unique types of tiles;
wherein each source code specification of a unique type tile specifies a set of logic resources that is different from sets of logic resources of all others of the plurality of unique types of tiles and a set of pins for coupling an instance of the unique type tile to an instance of the first type of tile, and the source code specifications of the plurality of unique types of tiles and of the first type of tile are separate data structure definitions.

16. The method of claim 15, wherein the sets of logic resources of the unique types of tiles include configurable logic blocks (CLBs), Random Access Memory (RAM) blocks, multiplier blocks, and processor blocks.

17. The method of claim 16, wherein the sets of logic resources of the unique types of tiles further include input/output blocks (IOBs).

18. The method of claim 15, further comprising representing in a computer memory relative placement of the instances of the first type tiles and instances of the unique type tiles based on row and column designations of the instances of the first type tiles.

* * * * *